(12) United States Patent
Starr

(10) Patent No.: US 8,583,990 B2
(45) Date of Patent: Nov. 12, 2013

(54) ERROR CORRECTION IN A STORAGE ELEMENT ARRAY

(75) Inventor: Matthew Thomas Starr, Lafayette, CO (US)

(73) Assignee: Spectra Logic Corporation, Boulder, CO (US)

( * ) Notice: Subject to any disclaimer, the term of this patent is extended or adjusted under 35 U.S.C. 154(b) by 98 days.

(21) Appl. No.: 13/307,841

(22) Filed: Nov. 30, 2011

(65) Prior Publication Data

US 2013/0139034 A1 May 30, 2013

(51) Int. Cl.
*H03M 13/00* (2006.01)
*G11C 29/00* (2006.01)

(52) U.S. Cl.
USPC ........... 714/766; 714/764; 714/767; 714/769; 714/770; 714/771; 714/773; 714/755; 714/758

(58) Field of Classification Search
None
See application file for complete search history.

(56) References Cited

U.S. PATENT DOCUMENTS

| | | | |
|---|---|---|---|
| 5,668,800 A | 9/1997 | Stevenson | |
| 5,883,854 A | 3/1999 | Saliba | |
| 6,269,330 B1 | 7/2001 | Cidon et al. | |
| 6,490,253 B1 | 12/2002 | Miller et al. | |
| 6,715,031 B2 | 3/2004 | Camble et al. | |
| 6,823,401 B2 | 11/2004 | Feather et al. | |
| 6,839,824 B2 | 1/2005 | Camble et al. | |
| 7,443,801 B2 | 10/2008 | Neidhardt et al. | |
| 7,492,720 B2 | 2/2009 | Pruthi et al. | |
| 7,573,664 B2 | 8/2009 | Bentley et al. | |
| 7,583,604 B2 | 9/2009 | Couturier | |
| 7,596,096 B2 | 9/2009 | Crawford et al. | |
| 2002/0006004 A1 | 1/2002 | Miyamura | |
| 2002/0055999 A1 | 5/2002 | Takeda | |
| 2003/0225865 A1 | 12/2003 | Koestler | |
| 2004/0076697 A1 | 4/2004 | Duncan | |
| 2004/0139195 A1 | 7/2004 | Feather et al. | |
| 2006/0092850 A1 | 5/2006 | Neidhardt et al. | |
| 2006/0190205 A1 | 8/2006 | Klein et al. | |
| 2007/0025008 A1 | 2/2007 | Ballard | |
| 2007/0294591 A1 | 12/2007 | Usynin et al. | |
| 2008/0019283 A1 | 1/2008 | Emile | |
| 2008/0259809 A1 | 10/2008 | Stephan et al. | |
| 2009/0198737 A1 | 8/2009 | Sims | |
| 2010/0265807 A1 | 10/2010 | Thompson | |
| 2011/0211273 A1 | 9/2011 | Thompson | |

*Primary Examiner* — Guerrier Merant
(74) *Attorney, Agent, or Firm* — Kenneth Altshuler

(57) ABSTRACT

An apparatus and associated method provided for a plurality of storage elements arranged and concurrently accessible in an array. A controller executes programming instructions stored in memory to append an error correction code (ECC) block to a first data block and to store the first data block with appended ECC block in a first storage element of the plurality, the appended ECC block associated with a second data block other than the first data block.

21 Claims, 10 Drawing Sheets

ERROR CORRECTION IN A STORAGE ELEMENT ARRAY

CROSS-REFERENCE TO RELATED APPLICATIONS

None.

BACKGROUND OF THE INVENTION

1. Field of the Invention

The claimed invention relates generally to correcting errors that occur in storing data, and more particularly, but not by way of limitation, to providing redundancy in error correction coding protection to enhance the error correction capability of a storage element array.

2. Description of Related Art

A storage element array is generally a cooperative arrangement of a plurality of storage elements that are individually, and preferably concurrently, accessible by a client device as if all the storage elements were lumped into one storage unit. The type or types of storage elements used is not limited, permitting the selection of different types of storage elements to leverage the inherent advantages of each under certain operating conditions and/or processing requirements. Typical storage elements include tape cartridges, disk drives, solid state drives, optical drives, semiconductor memory devices generally, and the like, and various combinations thereof.

A tape drive array, for example, includes a plurality of discrete tape drives under common control of an array controller. The array controller virtualizes the totality of the physical storage space afforded by the plurality of tape drives and selectable tape cartridges forming the array, and presents that totality of physical storage capacity to one or more clients in the form of one or more virtual storage spaces.

A tape drive is inherently susceptible to write errors due to defects or even just variations in the recording material of the tape cartridge. The ongoing demand for recording material capable of greater storage density concomitantly increases the adverse affects of these writing errors. That is, written error rates that could in the past be disregarded as negligible without adversely affecting either quality or performance now must be affirmatively reckoned with.

Preferably, these writing errors are corrected "on the fly" with minimal impact on throughput performance by using embedded Error Correction Code (ECC) and corresponding ECC processing (checksum) routines. ECC is, generally speaking, a cyclic redundancy code, such as but not necessarily limited to Reed-Solomon code. The error detection capability of ECC processing solutions is limited by the fact that both the user data being verified and the ECC are stored to the same recording medium and in very close proximity to each other. The claimed embodiments are directed to improvements in ECC processing.

SUMMARY OF THE INVENTION

In some embodiments an apparatus is provided having a plurality of storage elements arranged and concurrently accessible in an array. A controller executes programming instructions stored in memory to append an Error Correction Code (ECC) block to a first data block and to store the first data block with appended ECC block in a first storage element of the plurality, the appended ECC block associated with a second data block other than the first data block.

In some embodiments a method is provided including steps of appending to a block of data an ECC corresponding to the block of data; writing the appended block of data to a storage array of a plurality of different concurrently accessible storage elements; and writing a redundant copy of the ECC ($ECC_R$) to the array.

In some embodiments, an apparatus is provided having a plurality of storage elements arranged and concurrently accessible in an array to selectively store data to and retrieve data from each of the plurality of storage elements, and means for verifying data stored in a first storage element of the plurality independently of an existing quality state of the storage medium in which the data is stored in the first storage element.

DETAILED DESCRIPTION

Initially, it is to be appreciated that this disclosure is by way of example only, not by limitation. The concepts herein are not limited to use or application with a specific system or method for using storage element devices to form a storage array with redundancy capability for data recovery. Thus, although the instrumentalities described herein are for the convenience of explanation, shown and described with respect to exemplary embodiments, it will be appreciated that the principles herein may be applied equally in other types of storage element systems and methods involving the verification of stored data.

Figure 1:
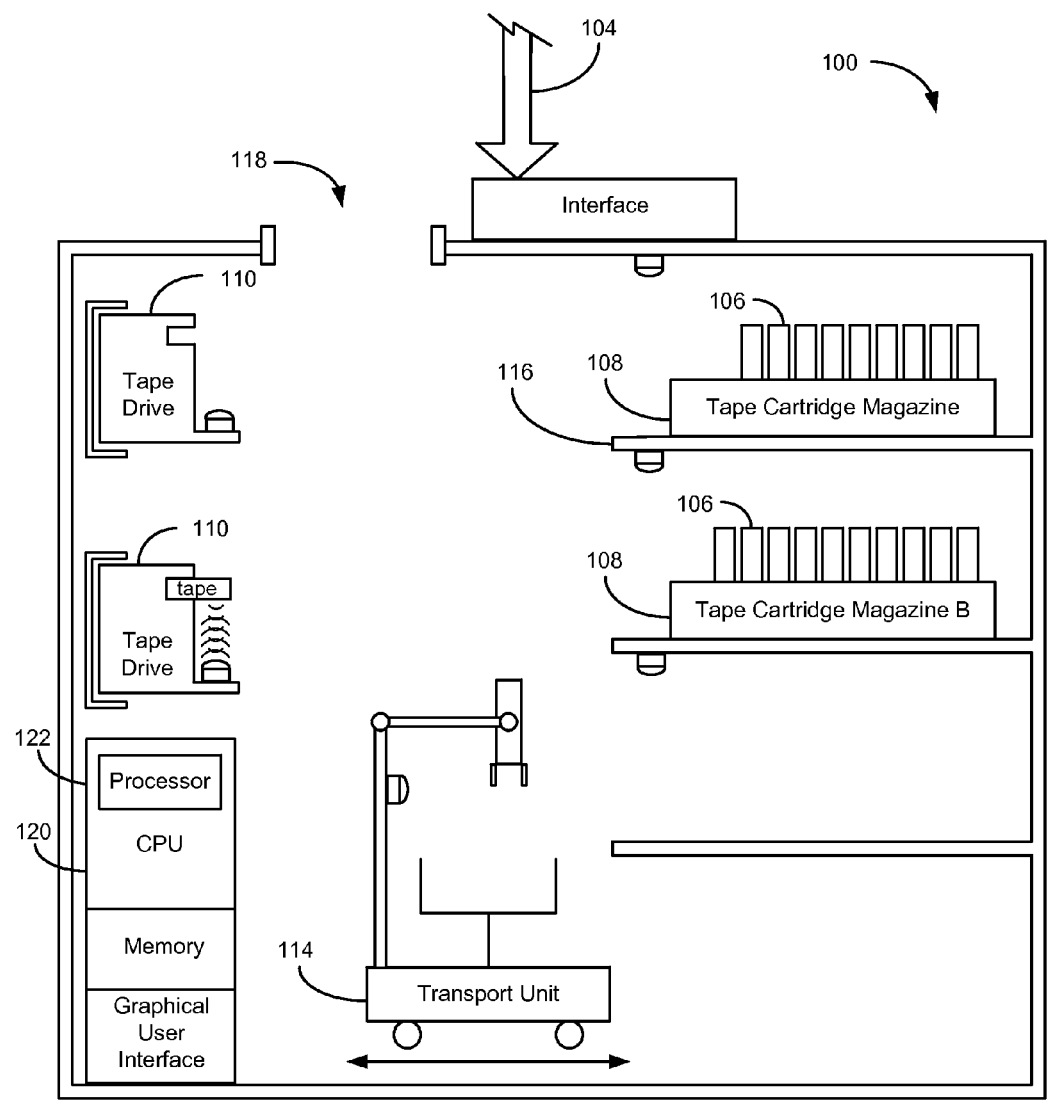
FIG. 1 diagrammatically depicts a tape library constructed in accordance with embodiments of the present invention.

FIG. 1 diagrammatically depicts a tape library 100. External communication for storing data to and retrieving data from the tape library is performed via an interface 102 coupled to a communication link 104. The number and arrangement of the various components depicted in FIG. 1 are merely illustrative and in no way are limiting of the claimed invention.

The tape library 100 has a plurality of tape cartridges 106 grouped in magazines 108. Each of the tape cartridges 106 is identifiable, such as by radio frequency identification (RFID) tags or semiconductor memory devices and the like, for selectively loading a desired one of the tape cartridges 106 into one of a plurality of tape drives 110. The latter can be used to advantageously write identifying information to the tape cartridge 106, such as access occurrence information or validity information and the like. For clarification sake, the term "tape drive" as used herein means the tape drive data transfer mechanism 110 operable with a selected tape cartridge 106 disposed therein.

A transport unit 114 shuttles magazines 108 between a shelf storage 116 and the tape drives 110, and picks and places a particular tape cartridge 106 from a shuttled magazine 108 to a desired tape drive 110. Again, although FIG. 1 diagrammatically depicts two magazines 108 of eleven tape cartridges 106 each being shuttled to and from two tape drives 110, that arrangement is merely illustrative and in no way limiting of the claimed embodiments. In any event, a desired number of tape drives 110 can be provided within the library 100 to concurrently access a corresponding number of tape cartridges 106 in a storage element array, or two or more libraries 100 can communicate with each other to form that same storage element array.

The tape library 100 is not necessarily limited to using a fixed number of tape cartridges 106. Rather, an access port 118 is configured to cooperate with an external transport system (not shown) to deliver or remove individual tape cartridges 106 or magazines 108.

Top level control is provided by a central processing unit (CPU) 120 in communication with all the various components via a computer area network (not shown). Data, virtual mappings, executable computer instructions, operating systems, applications, and the like are stored to memory and retrieved for processing by one or more processors 122. The CPU 120 includes macroprocessors, microprocessors, memory, and the like to logically carry out software algorithms and instructions.

Figure 2:
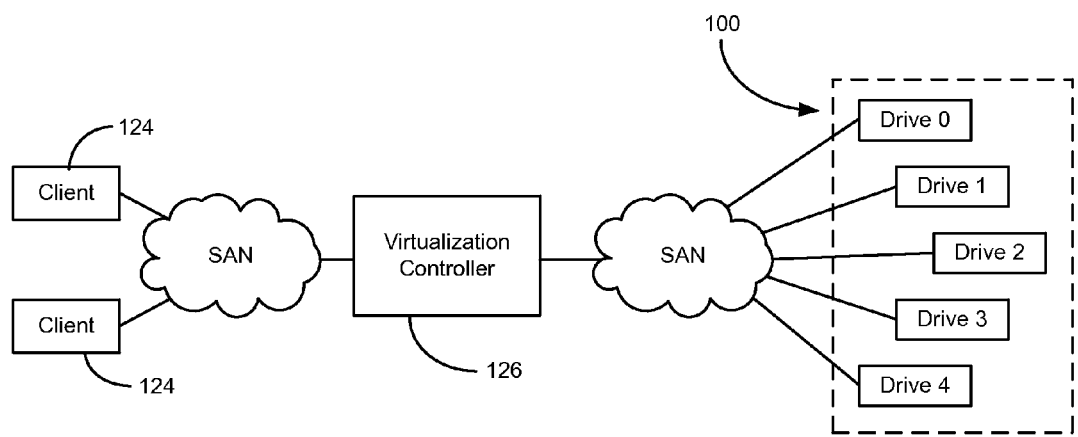
FIG. 2 is a block diagram of the tape library of FIG. 1 in a virtualized distributed storage system.

FIG. 2 diagrammatically depicts illustrative embodiments of the library 100 connected externally to a network to function as a storage element array in a distributed storage system. Each of the remote clients 124 can view the entire physical storage capacity of the tape library 100 (as collectively defined by the tape cartridges 106) as a unified storage space. A virtualization controller 126 is depicted in these illustrative embodiments as a network node that passes user data and storage management information between the tape library 100 and the clients 124 via network links such as, but not limited to, fibre channel storage area networks (SANs). The virtualization controller 126 also buffers data being transferred between the clients 124 and the tape library 100 to permit optimal tape cartridge 106 utilization and, in turn, data throughput performance.

Figure 3:
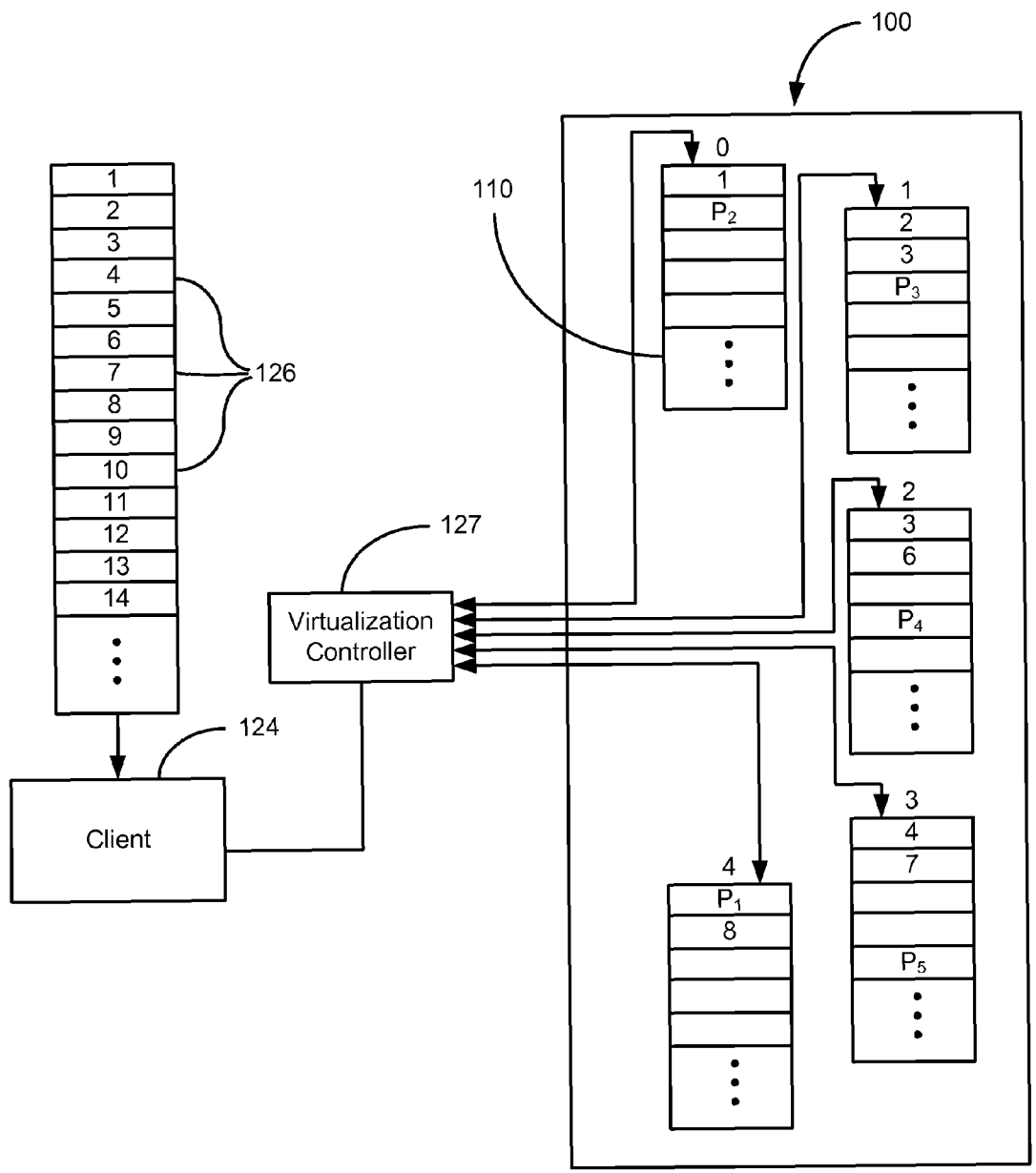
FIG. 3 is a block diagram depicting mapping of write data to the five tape drives in the tape library.

FIG. 3 diagrammatically depicts one of the clients 124 under the control of an operating system to write a stream of data blocks 126 to the tape library 100. The tape library 100 is configured to concurrently access five tape drives 110 labeled 0, 1, 2, 3, and 4. The operating environment treats the five tape drives 110 as a single storage space, referred to herein as a virtual tape drive. The controller 127 stripes the data blocks 126 across the tape drives 110 and interleaves parity data ($P_n$) to form a RAIT-5 (redundant array of independent tapes) storage array. Although a RAIT-5 array is used for purposes of this description, the claimed invention is in no way so limited.

Figure 4:
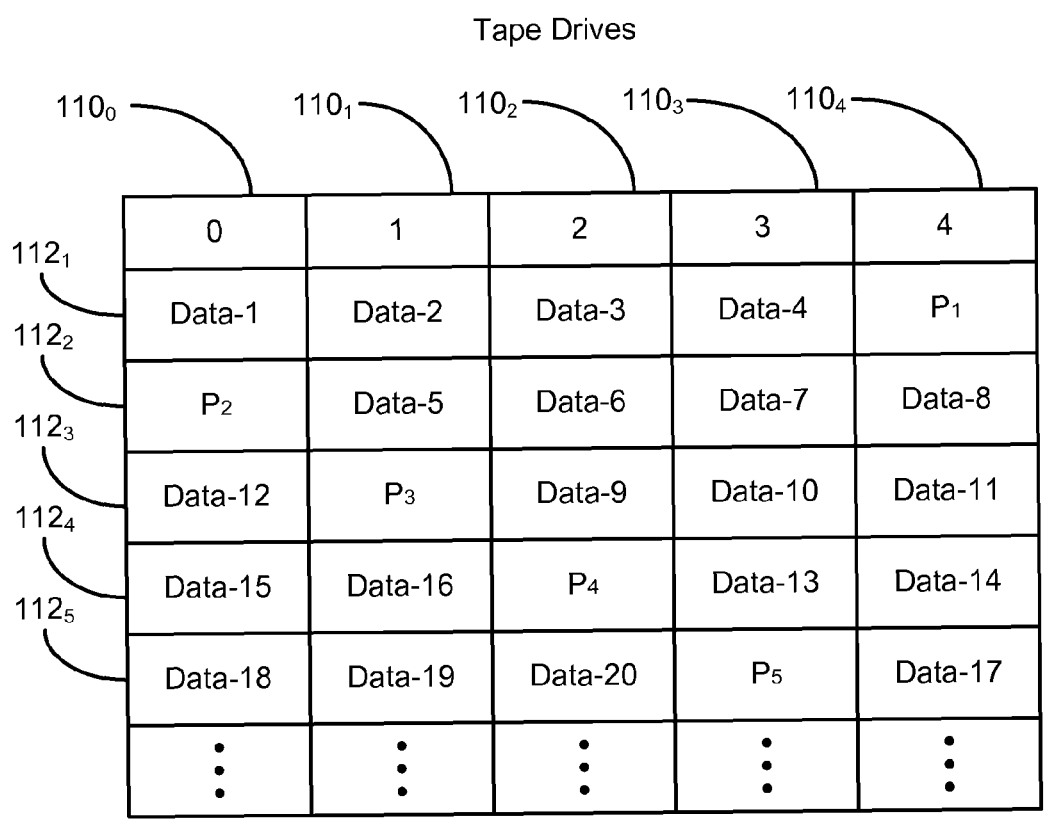
FIG. 4 depicts the mapping of FIG. 3 forming a RAIT-5 storage array.

FIG. 4 depicts the virtual tape drive mapping formed by the striping of the data blocks 126 into the RAIT-5 format tape drive array. In the RAIT-5 array, the data blocks 126 are allocated in stripes $112_n$ striped across the tape drives 110 (members 0-4) in a raster scan fashion. Interleaved within the data blocks is parity data ($P_n$). In the RAIT-5 array, the parity data is mapped in a diagonal manner across the tape drives 110.

Figure 5:
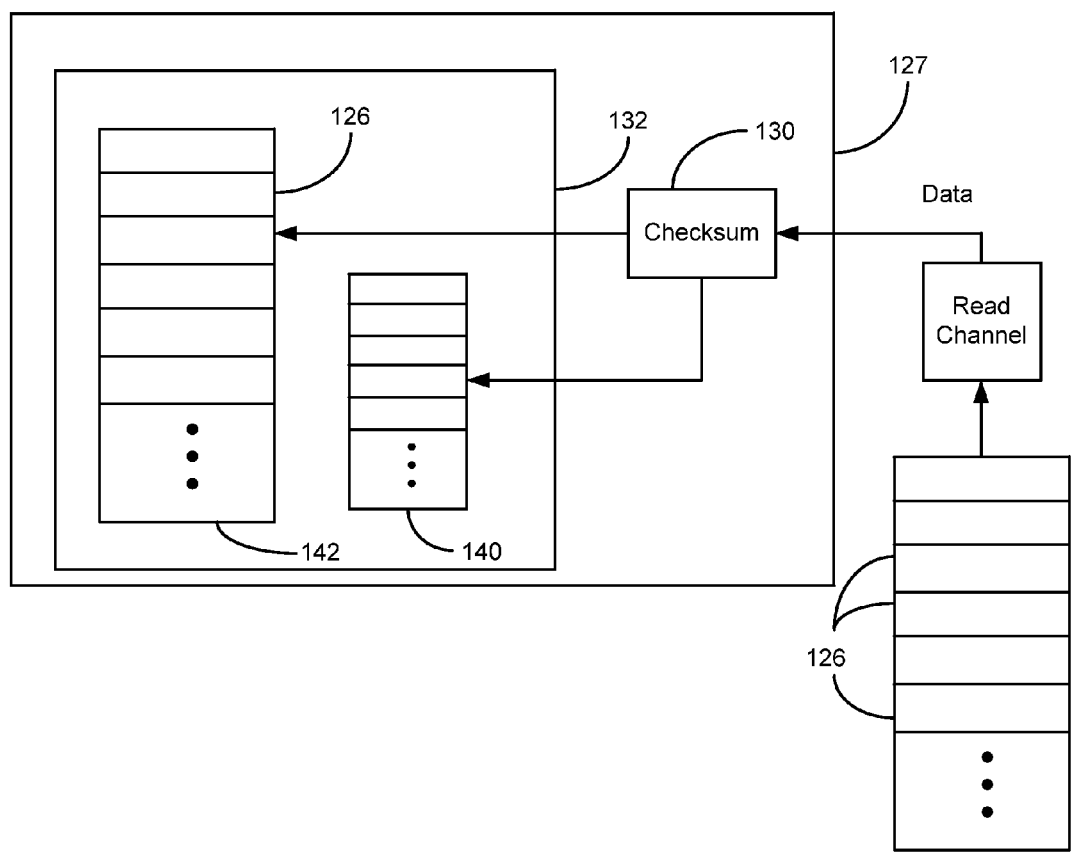
FIG. 5 is a block diagram of the checksum processing in the controller of FIG. 3.

FIG. 5 shows the controller 127 is capable of performing "on the fly" error correction by checksum circuitry 130 communicating with a buffer 132. During a write operation, the data blocks 126 are stored by the tape drives 110. Each data block 126 includes one or more sub-blocks of user data and a corresponding error correction code (ECC) appended to each sub-block. Shortly after the write is complete for a particular data block 126 (or each sub-block), the information just recorded to the storage medium is verified by a read head located a short distance from and trailing the write head. The read head reproduces the information, which has just been written, and communicates it via the read channel to the checksum circuit 130. The checksum circuit 130 performs ECC processing on the user data to derive another ECC (derived ECC, $ECC_{DER}$) and stores the $ECC_{DER}$ in a buffer table 140. The $ECC_{DER}$ is compared to the ECC portion of the data block 126 stored in a table 142. A match between ECC and $ECC_{DER}$ indicates the user data is valid. A mismatch, on the other hand, indicates the user data is invalid and thereby in need of data recovery processing.

Figure 6:
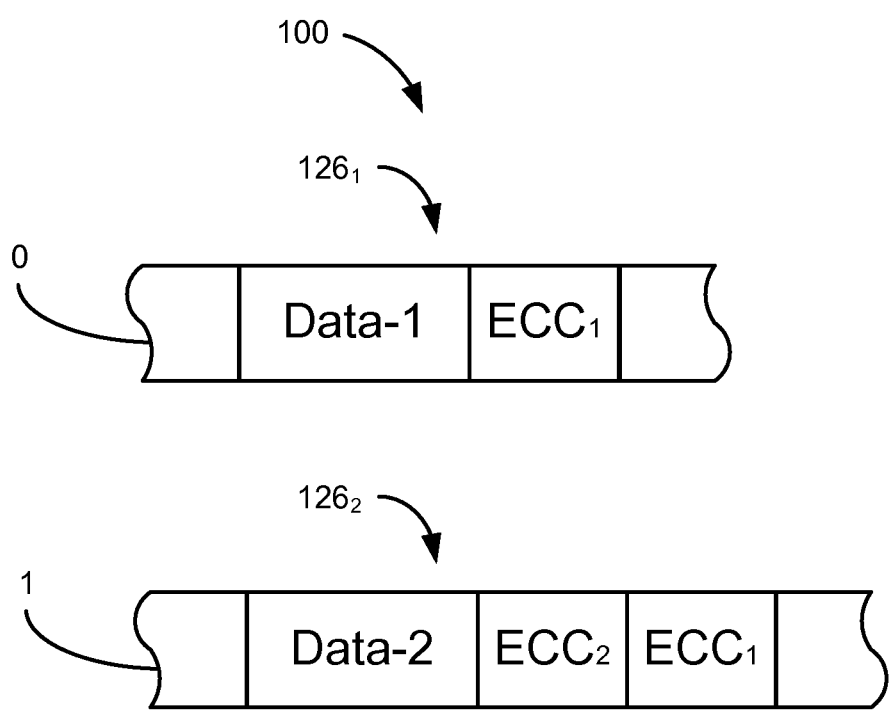
FIG. 6 diagrammatically depicts two tape drives writing data and ECC blocks to storage mediums of respective tape cartridges.

FIG. 6 diagrammatically depicts two of the tape drives 0, 1 writing data to portions of storage mediums in respective tape cartridges 106. Tape drive 0 has written a data block $126_1$ that includes a user data sub-block DATA-1 and an $ECC_1$ corresponding to the DATA-1. Tape drive 1 has written in accordance with embodiments of this invention likewise a data block $126_2$ that includes a user data sub-block DATA-2 and an $ECC_2$ corresponding to the DATA-2, and has also written a redundant copy of the ECC-1 corresponding to DATA-1.

Figure 7:
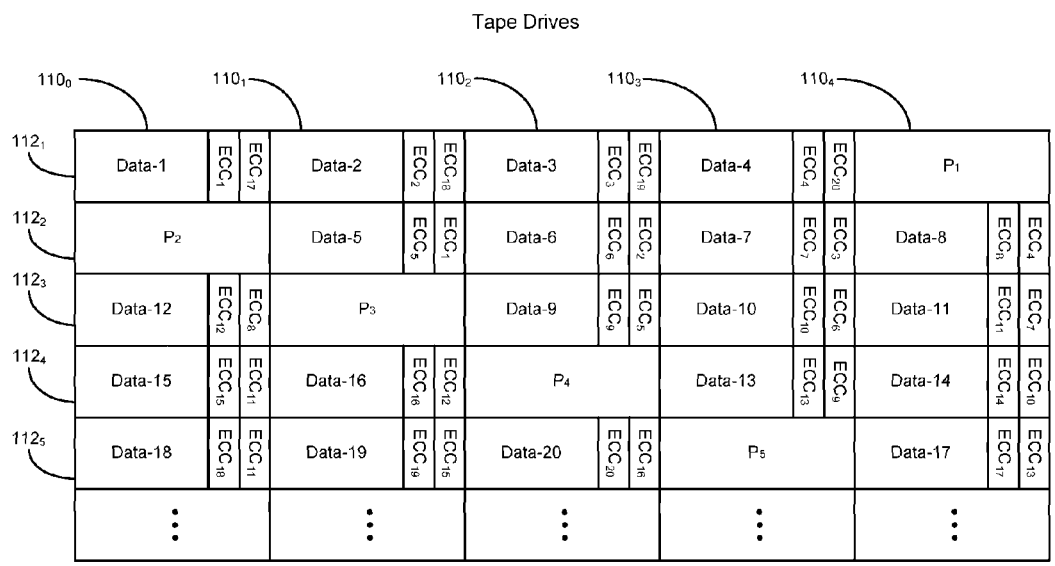
FIG. 7 depicts the mapping of FIG. 4 with ECC block details.

FIG. 7 depicts the RAIT-5 array 100 of FIG. 4, but further diagrammatically depicting each of the data blocks being appended with both its own ECC block and with another redundant ECC block associated with another data block. For example, the second stripe $112_2$ in storage element 104 contains data block DATA-5 with error correction code block $ECC_5$ (primary ECC block, $ECC_P$) appended thereto and associated therewith. That data block DATA-5 also has a redundant copy of $ECC_1$ (redundant ECC block, $ECC_R$) appended to it that is associated with the DATA-1 in the first stripe $112_1$ in storage element $110_0$. It will be noted that by cascading the distribution of the $ECC_R$ blocks in this manner any particular data block and the corresponding data block where its $ECC_R$ block resides are in different storage elements $110_n$ and in different stripes $112_n$ so that both the ECC block and the $ECC_R$ block can be concurrently accessed.

Figure 8:
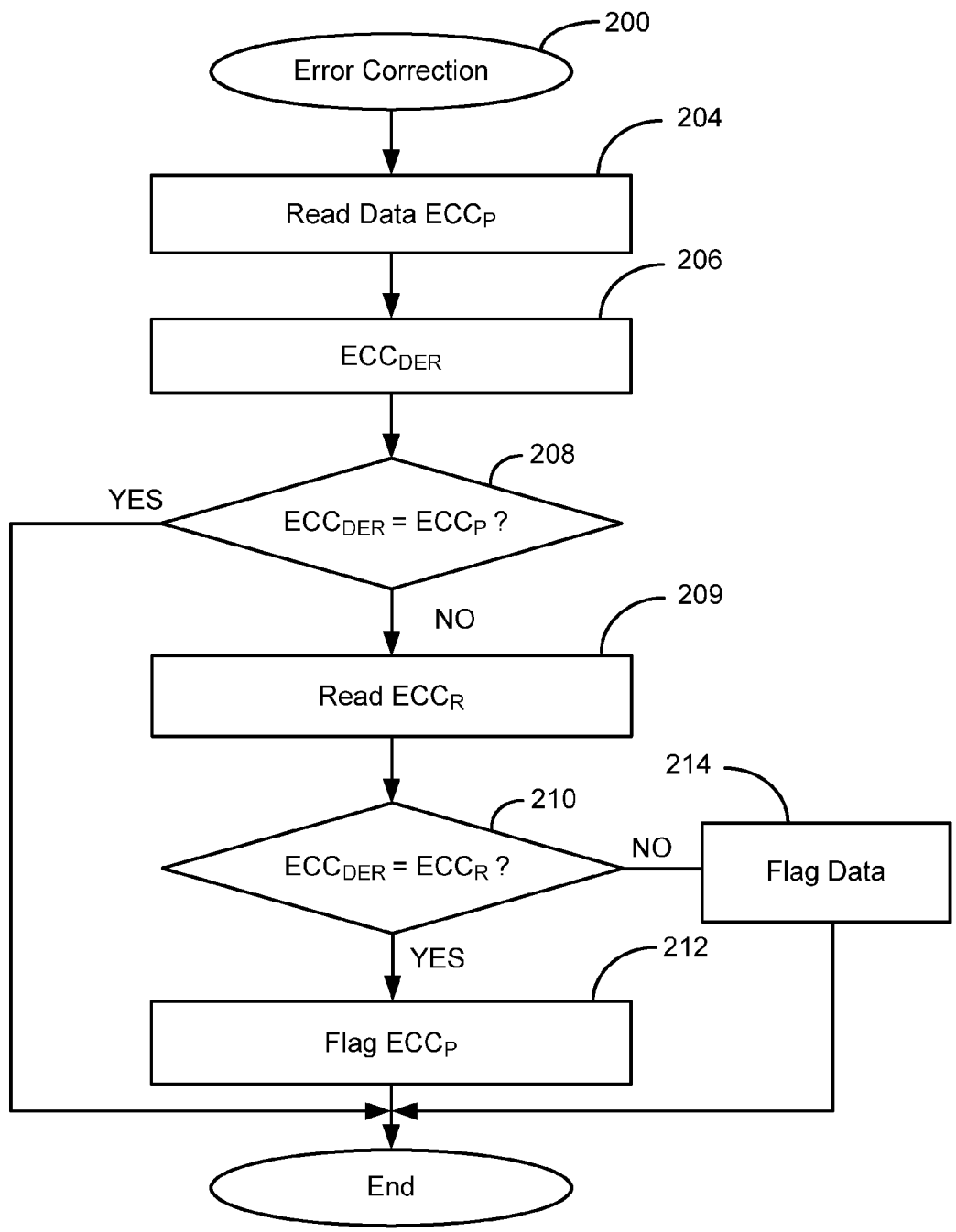
FIG. 8 is a flowchart of steps in an ERROR CORRECTION method in accordance with embodiments of the present invention.

FIG. 8 is a flowchart depicting steps for carrying out an illustrative error correction method 200 in accordance with embodiments of the present invention. The method 200 begins in block 204 with reading a selected DATA and its associated $ECC_P$. Block 206 derives $ECC_{DER}$ from the reading performed in block 204. In block 208 a determination is made as to whether the $ECC_{DER}$ obtained in block 206 matches the ECC obtained in block 204. The determination of block 208 can take place for each and every data block read from the array 100 in order to apply maximum scrutiny in the data verification process of these embodiments. Alternatively, the determination of block 208 can occur at a predefined frequency, or in other words to a predefined portion of the total number of blocks of data read from the array 100 to provide a statistical sampling that ensures a threshold scrutiny while facilitating a comparatively enhanced data throughput performance.

If the determination of block 208 is "yes," then the method 200 ends and processing continues with the selected DATA having been verified as being valid. However, if the determination of block 208 is "no," then in block 209 $ECC_R$ is read and the determination is made in block 210 as to whether the $ECC_{DER}$ obtained in block 206 matches the $ECC_R$. If the determination of block 210 is "yes," then the $ECC_P$ can be flagged for a data recovery processing in block 212 and the method 200 ends. If the determination of block 210 is "no," then the selected DATA is flagged for data recovery processing in block 214, the method 200 ends and processing continues with the DATA having failed verification.

Figure 9:
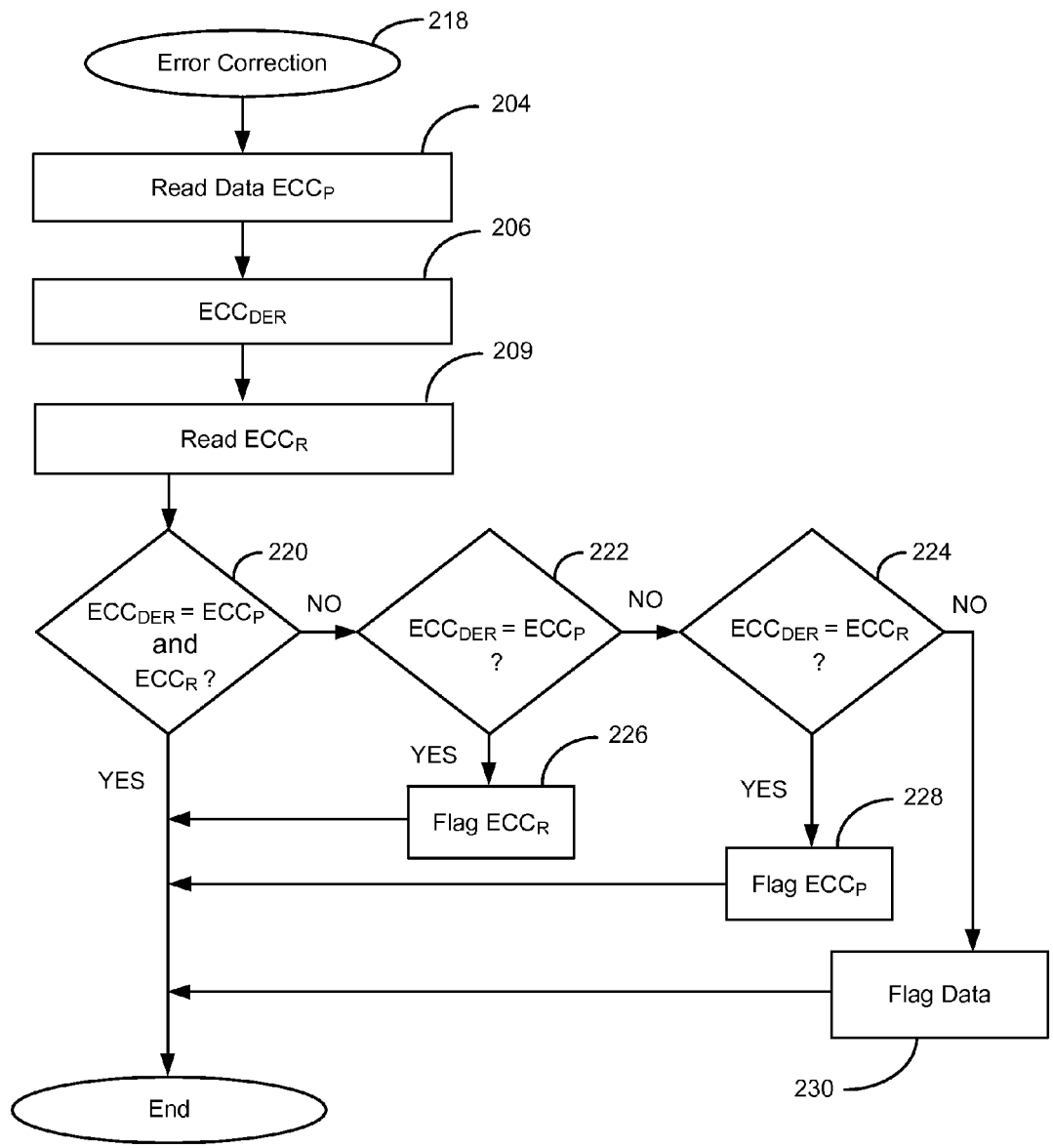
FIG. 9 is a flowchart of steps in an ERROR CORRECTION method in accordance with equivalent alternative embodiments of the present invention.

FIG. 9 is a flowchart depicting steps for carrying out an alternative illustrative error correction method 218 in accordance with embodiments of the present invention. Blocks 204, 206, and 209 are the same as in the method 200 depicted in FIG. 8, so for consistency sake they are labeled the same as in FIG. 8. In block 220 the determination is made as to whether the $ECC_{DER}$ obtained in block 206 matches both the $ECC_P$ and the $ECC_R$. As above, the frequency with which block 220 makes this determination can be predefined to balance a desired verification scrutiny against a desired throughput performance. If the determination of block 220 is "yes," then processing continues with DATA having been verified at a comparatively higher scrutiny at the dual ECC comparison in block 220 as compared to the single ECC comparison in block 208 of FIG. 8.

However, if the determination of block 220 is "no," then in blocks 222, 224 sub-determinations are made as to whether the $ECC_{DER}$ obtained in block 206 matches either the $ECC_P$ or the $ECC_R$, respectively. If the determination of block 222 is "yes," then the $ECC_R$ is flagged for data recovery processing in block 226 and the method ends. Similarly, if the determination of block 224 is "yes," then the ECC is flagged in block 228 and the method ends. If the determinations of both blocks 222, 224 are "no," then the selected DATA is flagged for data recovery processing in block 230 and the method ends.

Generally, the embodiments of the present invention contemplate a storage element array having a plurality of storage elements arranged and concurrently accessible in a desired redundancy arrangement to selectively store data to and retrieve data from each of the plurality of storage elements. The storage element array also has a means for verifying selected data objectively, meaning independently of the quality of the storage medium in which the selected data is stored. For purposes of this description and meaning of the appended claims, the term "means for verifying" encompasses the disclosed structure and equivalent structures that function to store a redundant copy of the ECC for a particular data block in a different storage element and in a different stripe than those that the particular data block itself resides in. "Means for verifying" explicitly does not encompass previous attempted solutions that retrieve both the selected data block being verified and its associated ECC from the same storage medium.

Figure 10:
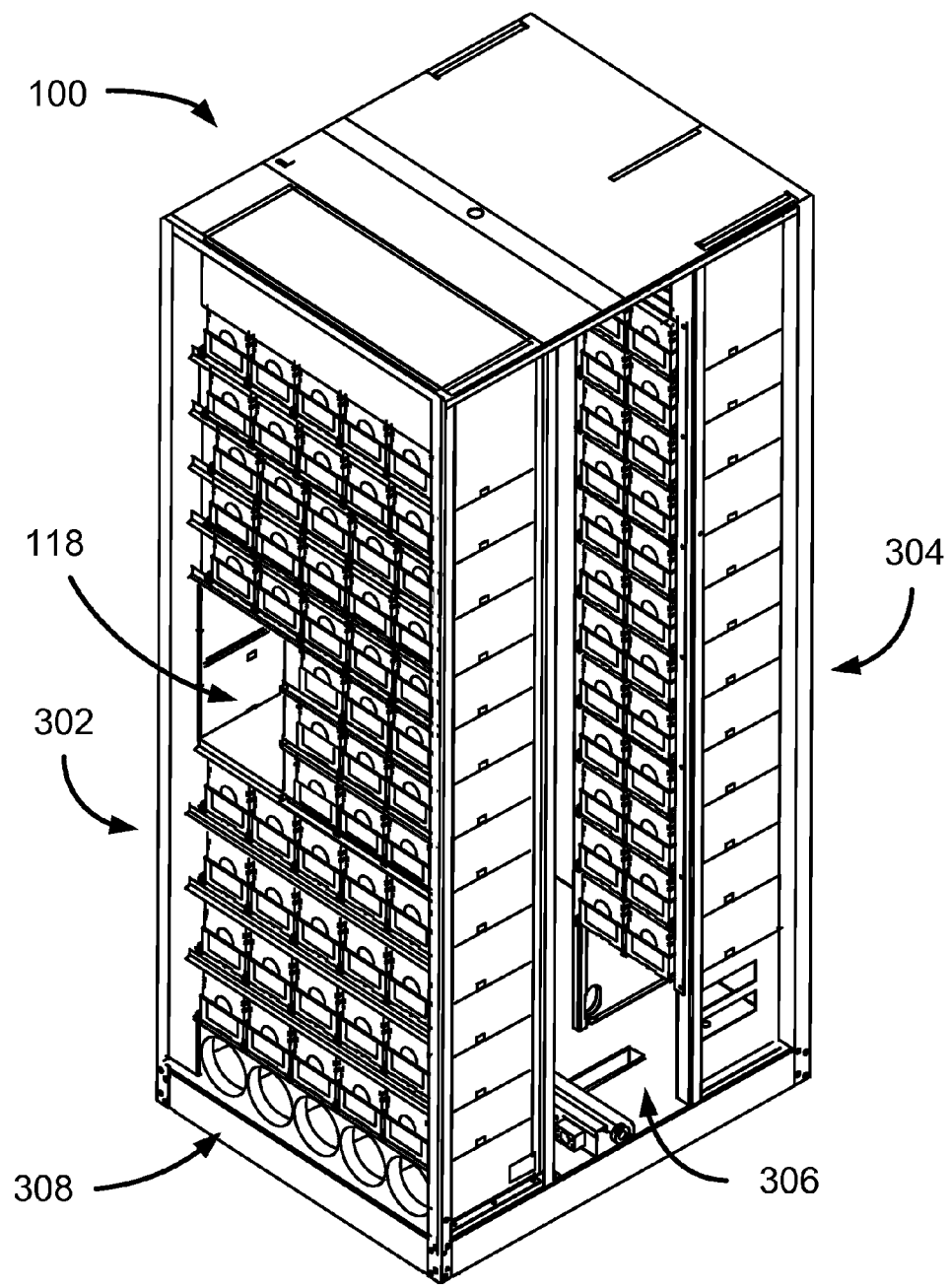
FIG. 10 depicts more details of the tape library of FIG. 1 constructed in accordance with embodiments of the present invention.

Embodiments of the present invention can be commercially practiced in a Spectra Logic T-950 tape cartridge library manufactured by Spectra Logic of Boulder Colo. FIG. 10 shows a commercial embodiment of one T-950 library unit 100 (FIG. 1) without an enclosure. The T-950 library 100 comprises a first and second shelf system 302, 304 that are adapted to support a plurality of the mobile media, such as the magazine 108 (FIG. 1) holding a plurality of LTO-3 tape cartridges 106 with MAMs, archived by the library 100. The shelf systems 302, 304 can each have at least one auxiliary memory reader. Disposed next to the second shelf system 304 are at least four IBM LTO-3 tape drives 110 adapted to write data to and read data from a tape cartridge 106. The IBM LTO-3 tape drives 110 each have the capability of storing data to an auxiliary radio frequency memory device contained in an LTO-3 tape cartridge 106. Functionally interposed between the first and second shelf system 302, 304 is a magazine transport space 306. The magazine transport space 306 is adapted to provide adequate space for a magazine 108 to be moved, via the transport unit 114 (FIG. 1), from a position in the first shelf system 302, for example, to a tape drive 108. The transport unit 114 can further accommodate at least one auxiliary radio frequency memory device reader. Magazines 108 can be transferred into and out from the T-950 library 100 via the entry/exit port 118. Transferring magazines 108 in and out of the T-950 library 100 can be accomplished by an operator for example. The T-950 library 100 comprises a means for cooling as shown by the fans 308, located at the base of the library 100. The T-950 library 100 can be linked to a central data base, providing control in storage of all of the auxiliary radio frequency memory devices contained in each tape cartridge 106 in the T-950 library 100 as read by any one of the auxiliary radio frequency memory device readers. The T-950 library 100 also comprises a library controller (not shown) that can function as the processor device in addition to an auxiliary storage device, such as a disk drive (or plurality of disk drives). The T-950 library 100 also provides a graphical user interface (not shown) whereon a display of assessment results or, in alternative embodiments, simple messages can be displayed pertaining to a user-specified action associated with a tape cartridge 106 such as an alert accompanying a sound alarm or recommendations for further action/s, for example.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, multiple, or all tape drives in a library, can be managed in the data verification process for example, while still maintaining substantially the same functionality without departing from the scope and spirit of the claimed invention. Another example can include using these techniques across multiple library partitions, while still maintaining substantially the same functionality without departing from the scope and spirit of the claimed invention. Further, though communication is described herein as between a client and the library, such as the library 100, communication can be received directly by a tape drive, via the interface device 102, for example, without departing from the scope and spirit of the claimed invention. Further, for purposes of illustration, a first and second tape drive and tape cartridges are used herein to simplify the description for a plurality of drives and tape cartridges. Finally, although the preferred embodiments described herein are directed to tape drive systems, and related technology, it will be appreciated by those skilled in the art that the claimed invention can be applied to other systems, without departing from the spirit and scope of the present invention.

It will be clear that the claimed invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the claimed invention disclosed and as defined in the appended claims.

It is to be understood that even though numerous characteristics and advantages of various aspects have been set forth in the foregoing description, together with details of the structure and function, this disclosure is illustrative only, and changes may be made in detail, especially in matters of structure and arrangement to the full extent indicated by the broad general meaning of the terms in which the appended claims are expressed.

What is claimed:

1. An apparatus comprising:
a plurality of storage elements arranged and accessible in an array; and
a controller executing instructions stored in a memory to store a data block in a first storage element of the plurality of storage elements, the data block including user data and an error correction code (ECC) block that is not associated with the user data.

2. The apparatus of claim 1 wherein the ECC block is characterized as a second ECC block, wherein the data block further includes a first ECC block that is associated with the user data.

3. The apparatus of claim 1 wherein the data block is a first data block and the second ECC block is associated with a second data block that is stored in a different second storage element of the plurality of storage elements.

4. The apparatus of claim 3 wherein a plurality of data blocks including the first and second data blocks are distributed to form M stripes across N storage elements, and wherein the second data block is stored in a different stripe than the first data block.

5. The apparatus of claim 4 wherein each of the plurality of data blocks has an ECC block that is associated with the respective user data and another ECC block that is not associated with the respective user data.

6. The apparatus of claim 5 further comprising ECC circuitry that reads the user data to derive an ECC block ($ECC_{DER}$) and compares the $ECC_{DER}$ to at least one of the first ECC and the second ECC to make a determination as to whether the user data is invalid and thereby in need of data recovery processing.

7. The apparatus of claim 6 wherein the ECC circuitry compares the $ECC_{DER}$ to both the first ECC and the second ECC to make the determination.

8. The apparatus of claim 7 wherein the ECC circuitry first compares the $ECC_{DER}$ to one of the first ECC and the second ECC, if that comparison indicates that the user data is invalid, then compares the $ECC_{DER}$ to the other of the first ECC and the second ECC to make the determination.

9. The apparatus of claim 1 wherein at least one of the storage elements comprises a tape drive.

10. A method comprising:
storing a first data block that includes user data and an error correction code (ECC) corresponding to the user data, the first data block stored in a storage array of a plurality of different concurrently accessible storage elements; and
storing a redundant copy of the ECC ($ECC_R$) to a different second data block in the storage array.

11. The method of claim 10 wherein the storing a first data block step is characterized by the ECC being a first ECC, and the first data block further including a second ECC that does not correspond to the user data.

12. The method of claim 10 further comprising:
after the storing steps, deriving an ECC ($ECC_{DER}$) from the user data;
comparing the $ECC_{DER}$ to a selected one of the ECC and the $ECC_R$; and
based on a predetermined condition, comparing the $ECC_{DER}$ to the other of the ECC and the $ECC_R$.

13. The method of claim 10 wherein the ECC is stored to a first storage element of the plurality of storage elements, and the $ECC_R$ is stored to a different second storage element of the plurality of storage elements.

14. The method of claim 12 wherein the comparing step is characterized by a determination of whether the user data is invalid and thereby in need of data recovery processing.

15. The method of claim 12 wherein the predetermined condition is characterized by performing the comparing step for a predefined portion of the user data.

16. The method of claim 12 wherein the predetermined condition is characterized by whether a comparison of the $ECC_{DER}$ to only one of the ECC and the $ECC_R$ indicates that the user data is invalid.

17. The method of claim 10 wherein the ECC and $ECC_R$ are stored concurrently.

18. The method of claim 17 wherein the storing a first data block step is characterized by distributing a plurality of data blocks including the first and second data blocks to form M stripes across N storage elements, and wherein the second data block is stored in a different stripe than the first data block.

19. The method of claim 18 wherein the storing steps are characterized by each of the plurality of data blocks including both an ECC that is associated with the respective data block and an $ECC_R$ that is not associated with the respective data block.

20. The method of claim 12 wherein the predetermined condition is characterized by comparing the $ECC_{DER}$ to the $ECC_R$ in conjunction with comparing the $ECC_{DER}$ to the ECC.

21. An apparatus comprising:
a plurality of storage elements arranged and concurrently accessible in an array to selectively store data to and retrieve data from each of the plurality of storage elements; and
means for verifying data stored in a first storage element of the plurality independently of an existing quality state of the storage medium in which the data is stored in the first storage element.

* * * * *